United States Patent
Chiu et al.

(10) Patent No.: US 11,984,486 B2
(45) Date of Patent: May 14, 2024

(54) METHOD OF IMPLANTING DOPANTS INTO A GROUP III-NITRIDE STRUCTURE AND DEVICE FORMED

(71) Applicant: Taiwan Semiconductor Manufacturing Co., Ltd., Hsinchu (TW)

(72) Inventors: Han-Chin Chiu, Kaohsiung (TW); Chi-Ming Chen, Zhubei (TW); Chung-Yi Yu, Hsinchu (TW); Chen-Hao Chiang, Jhongli (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/158,192

(22) Filed: Jan. 23, 2023

(65) Prior Publication Data

US 2023/0163183 A1 May 25, 2023

Related U.S. Application Data

(60) Continuation of application No. 17/166,775, filed on Feb. 3, 2021, now Pat. No. 11,594,606, which is a
(Continued)

(51) Int. Cl.
*H01L 29/423* (2006.01)
*H01L 29/20* (2006.01)
(Continued)

(52) U.S. Cl.
CPC .. *H01L 29/42364* (2013.01); *H01L 29/66462* (2013.01); *H01L 29/7787* (2013.01); *H01L 29/2003* (2013.01)

(58) Field of Classification Search
CPC ......... H01L 29/42364; H01L 29/66462; H01L 29/7787; H01L 29/2003
(Continued)

(56) References Cited

U.S. PATENT DOCUMENTS

| 8,912,570 B2 | 12/2014 | Chiang et al. |
| 2001/0045204 A1 | 6/2001 | Shidara |

(Continued)

FOREIGN PATENT DOCUMENTS

| KR | 1020010045204 | 6/2001 |
| KR | 100770132 | 10/2007 |

OTHER PUBLICATIONS

Alekseev, A.N. et al., "Multilayer AlN/AlGaN/GaN/AlGaN Heterostructures for High-Power Field Effect Transistors Growth by Ammonia MBE", Technical Physics Letters, vol. 31, No. 20 2005, pp. 864-867.
(Continued)

*Primary Examiner* — Igwe U Anya
(74) *Attorney, Agent, or Firm* — Slater Matsil, LLP

(57) ABSTRACT

A method including forming a III-V compound layer on a substrate and implanting a main dopant in the III-V compound layer to form source and drain regions. The method further includes implanting a group V species into the source and drain regions. A semiconductor device including a substrate and a III-V compound layer over the substrate. The semiconductor device further includes source and drain regions in the III-V layer, wherein the source and drain regions comprises a first dopants and a second dopant, and the second dopant comprises a group V material.

20 Claims, 7 Drawing Sheets

Related U.S. Application Data division of application No. 16/231,793, filed on Dec. 24, 2018, now Pat. No. 10,937,878, which is a continuation of application No. 13/753,867, filed on Jan. 30, 2013, now Pat. No. 10,164,038.

(51) Int. Cl.
*H01L 29/66* (2006.01)
*H01L 29/778* (2006.01)

(58) Field of Classification Search
USPC .......................................................... 257/76
See application file for complete search history.

(56) References Cited

U.S. PATENT DOCUMENTS

| | | | |
|---|---|---|---|
| 2005/0181536 A1 | 8/2005 | Tsuji | |
| 2006/0125001 A1 | 6/2006 | Sriram | |
| 2006/0226442 A1 | 10/2006 | Zhang et al. | |
| 2007/0164322 A1 | 7/2007 | Smith et al. | |
| 2008/0121895 A1 | 5/2008 | Sheppard et al. | |
| 2009/0166678 A1 | 7/2009 | Sato et al. | |
| 2009/0246924 A1 | 10/2009 | Niiyama et al. | |
| 2010/0012977 A1 | 1/2010 | Derluyn et al. | |
| 2010/0140664 A1* | 6/2010 | Sheppard | H01L 29/7787 257/E21.403 |
| 2010/0176371 A1 | 7/2010 | Lochtefeld | |
| 2010/0314663 A1 | 12/2010 | Ito et al. | |
| 2010/0314695 A1 | 12/2010 | Bol | |
| 2011/0092057 A1 | 4/2011 | Suvorov | |
| 2012/0122281 A1 | 5/2012 | Chang et al. | |
| 2012/0319127 A1* | 12/2012 | Chowdhury | H01L 29/0646 257/E29.089 |
| 2013/0056793 A1 | 3/2013 | Srinivasan | |
| 2013/0069116 A1 | 3/2013 | Chen et al. | |
| 2013/0153963 A1 | 6/2013 | Shealy | |
| 2014/0042446 A1 | 2/2014 | Chiang et al. | |
| 2014/0153963 A1 | 6/2014 | Yamamoto | |

OTHER PUBLICATIONS

Jeong, Chang Oh et al., "The Role of Complementary Species in P/Be and Ar/Be Co-Implanted InP," Journal of Electronic Materials, vol. 21, No. 8, 1992, pp. 825-829.

* cited by examiner

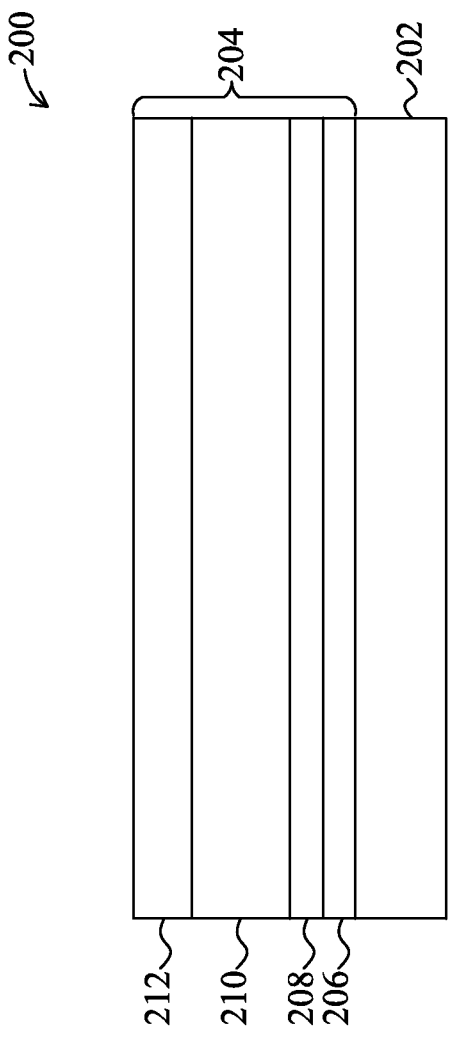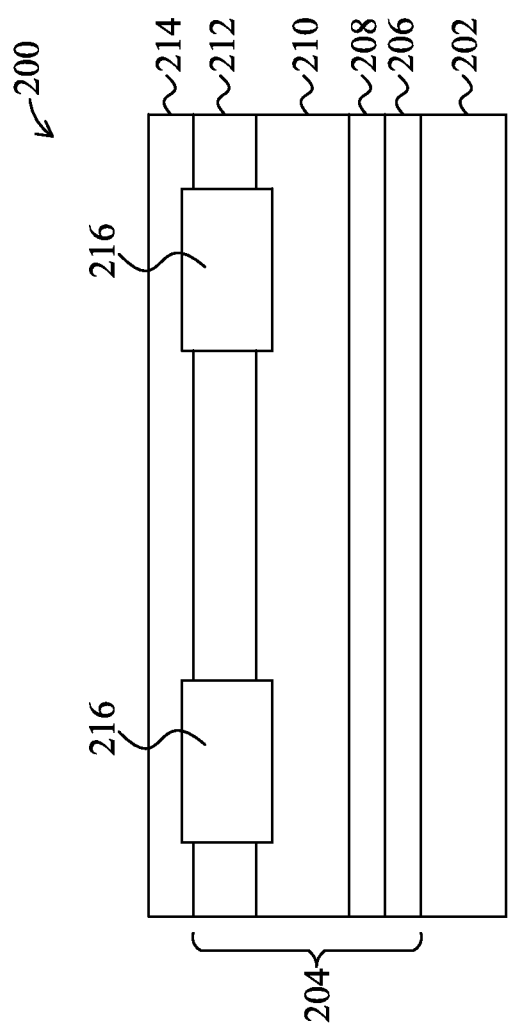

METHOD OF IMPLANTING DOPANTS INTO A GROUP III-NITRIDE STRUCTURE AND DEVICE FORMED

PRIORITY CLAIM AND CROSS-REFERENCE

This application is a continuation of U.S. application Ser. No. 17/166,775, filed on Feb. 3, 2021, which is a divisional of U.S. application Ser. No. 16/231,793, filed Dec. 24, 2018, now U.S. Pat. No. 10,937,878, issued on Mar. 2, 2021, which is a continuation of U.S. application Ser. No. 13/753,867, filed Jan. 30, 2013, now U.S. Pat. No. 10,164,038, issued Dec. 25, 2018, which applications are hereby incorporated herein by reference.

BACKGROUND

Semiconductor devices which include a group III-nitride compound, such as gallium nitride, are used in a device which operates at high frequencies or using high operating voltages. Group III-nitride compounds are also used in optoelectronic devices such as light emitting diodes (LEDs). In order to increase conductivity of the group III-nitride compounds, silicon or magnesium is implanted into source and drain regions of the group III-nitride compound and dopant activation using an annealing process. The implantation process and annealing process increase a number of charge carriers in the group III-nitride compound.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIGS. 2A-2G are cross sectional views of the semiconductor device formed using the method of FIG. 1 in accordance with one or more embodiments.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
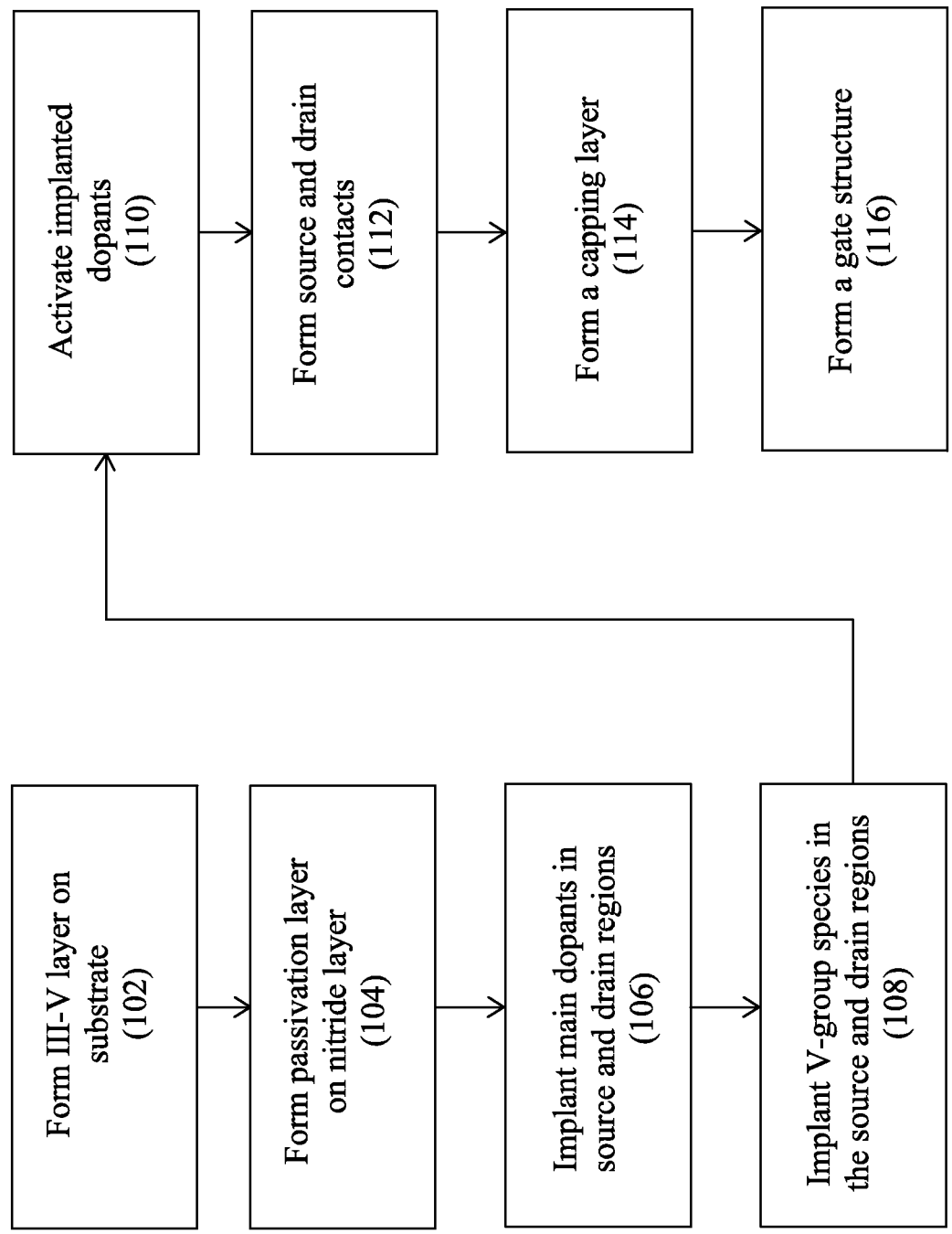
FIG. 1 is a flow chart of a method of forming a semiconductor device in accordance with one or more embodiments.

FIG. 1 is a flow chart of a method 100 of forming a semiconductor device in accordance with one or more embodiments. In operation 102, a III-V layer is formed over a substrate. In some embodiments, the III-V layer comprises a group III-nitride compound layer. In some embodiments, the group III-nitride compound layer is grown by an epitaxial process. In some embodiments, the epitaxial process is a molecular beam epitaxial process. In some embodiments, the group III-nitride compound layer is formed by metal-organic chemical vapor deposition (MOCVD). In some embodiments, the group III-nitride compound layer is formed by forming at least one buffer layer between a main group III-nitride compound layer and the substrate. In some embodiments, the nitride layer is formed to have a top group III-nitride compound layer over the main group III-nitride compound layer.

FIG. 2A is a cross sectional view of a semiconductor device 200 following operation 102 in accordance with one or more embodiments. A III-V layer 204 is formed over a substrate 202. III-V layer 204 is also called group III-nitride compound layer 204. The group III-nitride compound layer 204 comprises a multi-layer structure. The group III-nitride compound layer 204 comprises a first buffer layer 206 over substrate 202, a second buffer layer 208 over the first buffer layer, a main group III-nitride compound layer 210 over the second buffer layer and a top group III-nitride compound layer 212 over the main group III-nitride compound layer. In some embodiments, the group III-nitride compound layer 204 includes only one buffer layer. In some embodiment, top group III-nitride compound layer 212 is omitted.

In some embodiments, substrate 202 comprises an elementary semiconductor including silicon or germanium in crystal, or polycrystalline structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

A crystal structure of first buffer layer 206 is more similar to main group III-nitride compound layer 210 than a crystal structure of substrate 202 is to the main group III-nitride compound layer. The increased similarity in crystal structure facilitates formation of main group III-nitride compound layer 210 on substrate 202. In some embodiments, first buffer layer 206 comprises aluminum nitride (AlN). In some embodiments, first buffer layer 206 has a thickness ranging from about 20 Angstrom (Å) to about 500 Å. If the thickness of first buffer layer 206 is less than about 20 Å, the first buffer layer does not provide sufficient electrical resistance between main group III-nitride compound layer 210 and substrate 202 and provides insufficient wetting enhancement, in some embodiments. Further, if the thickness of first buffer layer 206 is out of the indicated range, stresses between the crystal lattice structure of second buffer layer 208 and substrate 202 remain high and result in cracks or de-lamination of the second buffer layer, in some instances.

Second buffer layer 208 has a crystal structure more similar to main group III-nitride compound layer 210 than first buffer layer 206. The similar crystal structure aids in the formation of main group III-nitride compound layer 210. The combination of first buffer layer 206 and second buffer layer 208 changes a crystal structure at a surface of substrate 202 to a crystal structure more similar to main group III-nitride compound layer 210, thereby enhancing an ability to form the main group III-nitride compound layer. In some embodiments, second buffer layer 208 comprises aluminum gallium nitride (AlGaN). In some embodiments, second buffer layer 208 has a thickness ranging from about 20 Å to about 500 Å. Further, if the thickness of second buffer layer 208 is out of the indicated range, stresses between the crystal lattice structure of second buffer layer 208 and main group III-nitride compound layer 210 remain high and result in cracks, de-lamination of main group III-nitride compound layer 210, or crystal quality degradation of main group III-nitride compound layer 210, in some instances. Note that the definition of crystal quality here means the amounts of point defect or dislocation density in crystal layers; while good crystal quality have lower point defect or dislocation density ($<10^8$ cm$^{-3}$ for GaN crystal).

Main group III-nitride compound layer 210 provides a charge carrying layer for the semiconductor device. In some embodiments, the main group III-nitride compound layer 210 comprises gallium nitride (GaN). In some embodiments, main group III-nitride compound layer may be replaced by other suitable III-V layer comprises gallium arsenide (GaAs), indium phosphate (InP), indium gallium arsenide (InGaAs), indium aluminum arsenide, (InAlAs), gallium antimonide (GaSb), aluminum antimonide (AlSb), aluminum arsenide (AlAs), aluminum phosphate (AlP) or gallium phosphate (GaP). Main nitride layer 210 has a crystal structure similar to second buffer layer 208. In some embodiments, main group III-nitride compound layer 210 has a thickness ranging from about 1 micrometer (μm) to about 10 μm.

Top group III-nitride compound layer 212 is formed on the main group III-nitride compound layer 210 as the strain layer during subsequent processing. A band gap discontinuity exists between the top group III-nitride compound layer 212 and the main group III-nitride compound layer 210. The top group III-nitride compound layer 212 has a band gap higher than of the main group III-nitride compound layer 210. Electrons are formed on the top of main group III-nitride compound layer 210, due to a piezoelectric effect, creating a thin layer of highly mobile conducting electrons. This thin layer is referred to as a two-dimensional electron gas (2-DEG), forming a carrier channel. The carrier channel of 2-DEG is located at main group III-nitride compound layer 210 near an interface of top group III-nitride compound layer 212 and the main group III-nitride compound layer 210. The carrier channel has high electron mobility, in comparison with doped layers, because main group III-nitride compound layer 210 is undoped or unintentionally doped, and the electrons move freely without collision or with substantially reduced collisions with impurities. In some embodiments, top group III-nitride compound layer 212 comprises an aluminum gallium nitride ($Al_xGa_{1-x}N$). In some embodiments, a thickness of top group III-nitride compound layer 212 ranges from about 20 Å to about 300 Å. In this range of thickness, the top group III-nitride compound layer 212 can provide a sufficient piezoelectric effect to form the 2-DEG on the top of the group III-nitride compound layer 210.

Returning to FIG. 1, in operation 104, a passivation layer is formed over the group III-nitride compound layer. In some embodiments, the passivation layer is formed by chemical vapor deposition (CVD), atomic-layer-deposition, physical vapor deposition (PVD), sputtering, combinations thereof or other suitable processes.

In operation 106, main dopants of source and drain regions are implanted into the III-V layer. In some embodiments, the source and drain regions are formed by ion implantation through the passivation layer into the III-V layer. In some embodiments, the source and drain regions comprise p-type dopants. In some embodiments, the source and drain regions comprise n-type dopants.

FIG. 2B is a cross sectional view of semiconductor device 200 after operation 104 and operation 106 in accordance with one or more embodiments. A passivation layer 214 is over the group III-nitride compound layer 204. Passivation layer 214 acts as an etch stop layer over the group III-nitride compound layer 204, in some embodiments. Passivation layer 214 acts as an etch stop layer, for example, during formation of a gate structure on top group III-nitride compound layer 212. In some embodiments, passivation layer 214 comprises silicon nitride (SiN), silicon oxide (SiO), silicon oxynitride (SiON), aluminum oxide ($Al_2O_3$) or other suitable material. In some embodiments, passivation layer 214 has a thickness ranging from about 10 nanometers (nm) to about 800 nm. If the thickness of passivation layer 214 is less than about 10 nm, the passivation layer does not effectively prevent etching of group III-nitride compound layer 204, in some embodiments. If the thickness of passivation layer 214 is greater than about 800 nm, a size of the passivation layer increases without significant benefit decreasing production cost efficiency, in some embodiments.

Main dopants are implanted in the group III-nitride compound layer 204 to form source and drain regions 216 by an implantation process. In some embodiments, the main dopants include silicon, magnesium, beryllium, calcium, zinc, germanium, sulfur, selenium or combinations thereof. A particular main dopant is selected based on whether the source and drain regions are p-type doped or n-type doped regions. In some embodiments, the dopants comprise silicon or other suitable n-type dopants. In some embodiments, the dopants comprise magnesium or other suitable p-type dopants. In some embodiments, a concentration of dopants in source and drain regions 216 ranges from about $1\times10^{18}$ atoms/cm$^3$ to about $1\times10^{21}$ atoms/cm$^3$. If the dopant concentration is less than about $1\times10^{18}$ atoms/cm$^3$, source and drain regions 216 do not provide sufficient charge carriers for semiconductor device 200 to function proper, in some embodiments. If the dopant concentration exceeds about $1\times10^{21}$ atoms/cm$^3$, source and drain regions 216 become saturated, in some embodiments. If semiconductor device 200 becomes saturated, the semiconductor device behaves similar to a constant-current source because charge carriers are not blocked from flowing through the semiconductor device. In some embodiments, source and drain regions 216 extend into group III-nitride compound layer 204 to a depth ranging from about 5 nm to about 100 nm. In some embodiments, the depth of source and drain regions 216 extends through top group III-nitride compound layer 212 into main group III-nitride compound layer 210. If the depth is less than about 5 nm, source and drain regions 216 form a channel layer having a high resistance which negative impacts performance of semiconductor device 200, in some embodiments. If the depth exceeds about 100 nm, source and drain regions 216 increase leakage through the group III-nitride compound layer 204 into substrate 202, in some embodiments.

Returning to FIG. 1, in operation 108, group V species are implanted into the source and drain regions. In some embodiments, operation 108 is performed simultaneously with operation 106 or before operation 106. In some embodiments, the group V species are implanted using an ion implantation process. Group V species include vanadium, niobium, tantalum, protactinium, nitrogen, phosphorous, arsenic, antimony and bismuth or combinations thereof. By combining the group V species with the main dopants, a dopant activation efficiency is increased in comparison with semiconductor devices which do not include group V species. Dopant activation efficiency is a ratio of dopants capable of acting as charge carriers in the semiconductor device to a total number of dopants present. In some embodiments, dopant activation efficiency is increased by about 10% in comparison to a dopant activation efficiency for semiconductor devices without group V species. In some embodiments, the dopant activation efficiency is greater than about 60%.

Figure 2C:
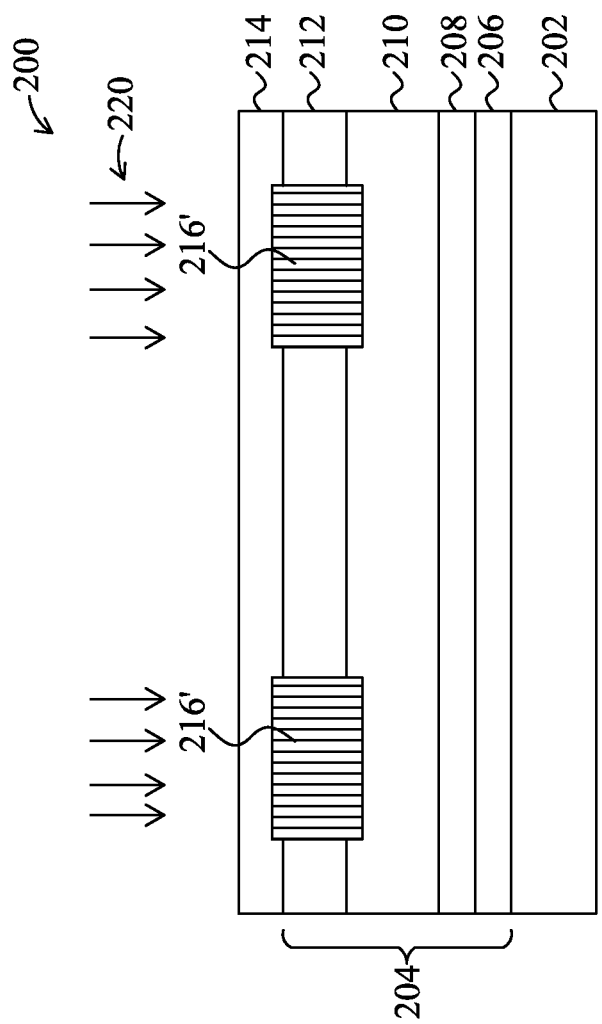

FIG. 2C is a cross sectional view of semiconductor device 200 after operation 108 in accordance with some embodiments. Group V species are implanted into source and drain regions 216 by implantation process 220 to form source and drain regions 216'. As the concentration of dopants source and drain regions 216' increases, a resistivity of semiconductor device 200 decreases. For example, if a dopant concentration is approximately $9 \times 10^{20}$ atoms/cm$^3$, the resistivity of semiconductor device 200 is approximately $1.8 \times 10^{-3}$ Ωcm. If a dopant concentration is approximately $1.5 \times 10^{19}$ atoms/cm$^3$, the resistivity of semiconductor device 200 is approximately $1.8 \times 10^{-2}$ Ωcm. If a dopant concentration is approximately $1 \times 10^{18}$ atoms/cm$^3$, the resistivity of semiconductor device 200 is approximately $1.5 \times 10^{-1}$ Ωcm.

In some embodiments, a ratio of the main dopants to the group V species ranges from about 1,000:1 to about 10:1. If the ratio is less than about 1,000:1, an amount of group V species is insufficient to impact the dopant activation efficiency and a dopant activation temperature, in some embodiments. If the ratio is greater than about 10:1, a number of p-type or n-type dopants in source and drain regions 216' is insufficient for semiconductor device 200 to function properly, in some embodiments.

Returning to FIG. 1, in operation 110, dopants in the source and drain regions are activated (also referred to as a dopant activation process). In some embodiments, the dopants are activated by an annealing process. In some embodiments, the annealing process is a rapid thermal annealing process, a flash annealing process, a laser annealing process, a furnace annealing process or another suitable annealing process. In some embodiments, the annealing process is performed using front-side heating, back-side heating or a combination thereof. In some embodiments, a temperature of the dopant activation process ranges from about 800° C. to about 1200° C. If the temperature is less than about 800° C., a number of activated dopants is insufficient for the semiconductor device to function properly, in some embodiments. If the temperature is greater than about 1200° C., damage occurs to portions of the semiconductor device or expensive high temperature materials are used to form the semiconductor device to avoid damage, in some embodiments. In some embodiments, a duration of the anneal process ranges from about 10 μs to about 20 minutes. In semiconductor devices which do not include the group V species, the temperature of the activation process is greater than approximately 1350° C. The higher temperature used in semiconductor devices which do not include group V species increases production costs because energy costs are increased, and expensive high temperature materials are used to form the semiconductor device. In contrast, semiconductor devices which include the group V species are processed at a lower temperature and are able to be formed using less expensive materials. The lower processing temperature also reduces the risk of damage to components of the semiconductor device during the annealing process.

Figure 2D:
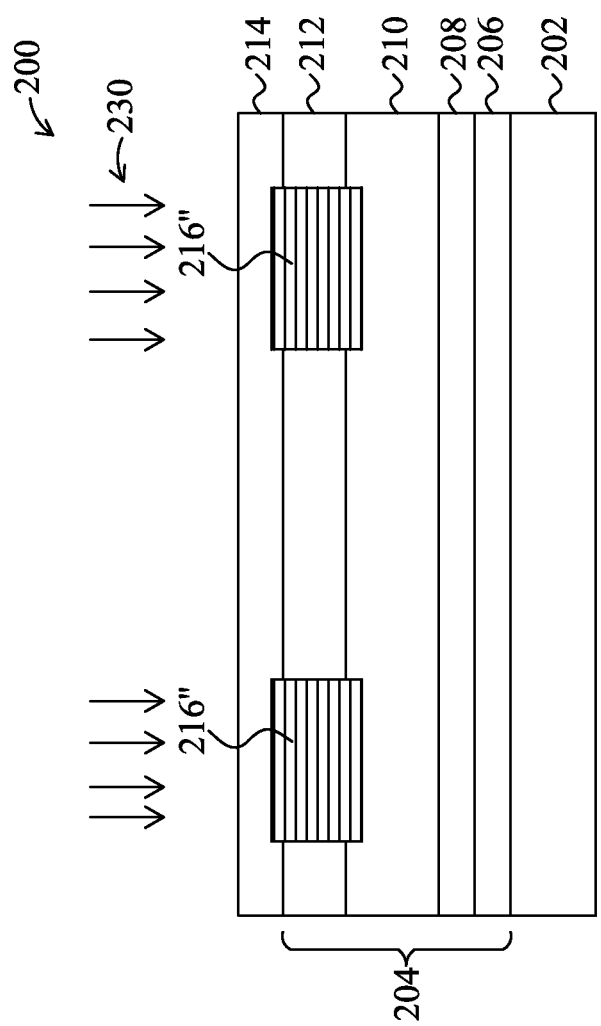

FIG. 2D is a cross sectional view of semiconductor device 200 after operation 110 in accordance with one or more embodiments. Dopant activation process 230 is used to activate dopants in source and drain regions 216' to form source and drain regions 216".

Returning to FIG. 1, in operation 112, source and drain contacts are formed. In some embodiments, the source and drain contacts are formed by etching an opening in the passivation layer and forming a conductive layer in the opening in contact with the source and drain regions.

Figure 2E:
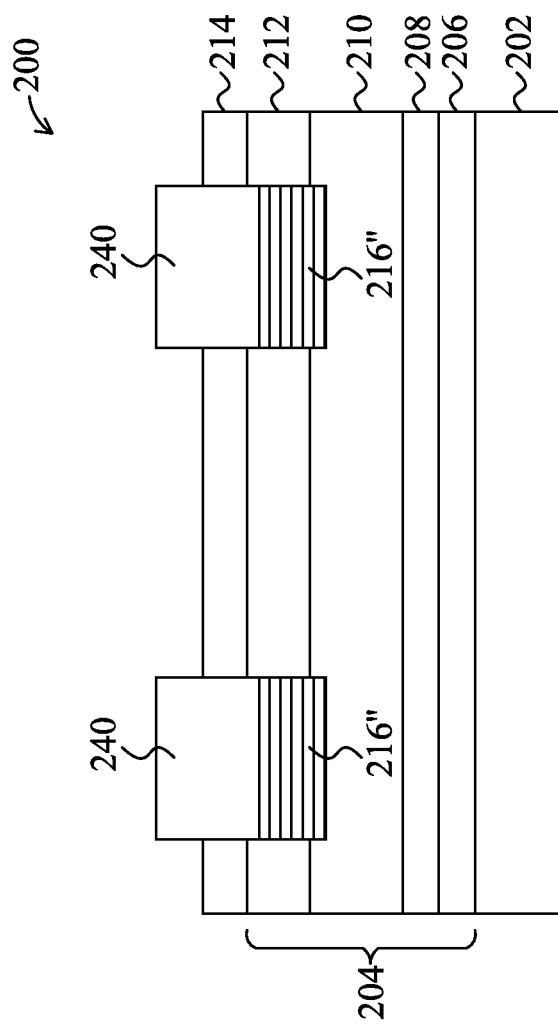

FIG. 2E is a cross sectional view of semiconductor device 200 after operation 112 in accordance with one or more embodiments. Source and drain contacts 240 are formed in contact with source and drain regions 216". In some embodiments, source and drain contacts 240 are copper, aluminum, tungsten, combinations thereof or other metallic compounds. In some embodiments, source and drain contacts 240 form an ohmic contact with source and drain regions 216". The ohmic contact between source and drain contacts 240 and source and drain regions 216" which is higher quality than semiconductor devices which do not include group V species in the source and drain regions. The higher quality ohmic contact is a product of the lower resistance in source and drain regions 216" resulting from the inclusion of the group V species. In some embodiments, source and drain contacts 240 comprise polysilicon or other conductive material.

Returning to FIG. 1, in operation 114, a capping layer is formed over the source and drain contacts and over the passivation layer. In some embodiments, the capping layer is formed by CVD, PVD, sputtering or other suitable formation process. In some embodiments, an opening is formed in the capping layer and the passivation layer to expose a portion of the nitride layer between the source and drain regions. In some embodiments, the passivation layer acts as an etch stop layer during formation of the opening in the capping layer.

Figure 2F:
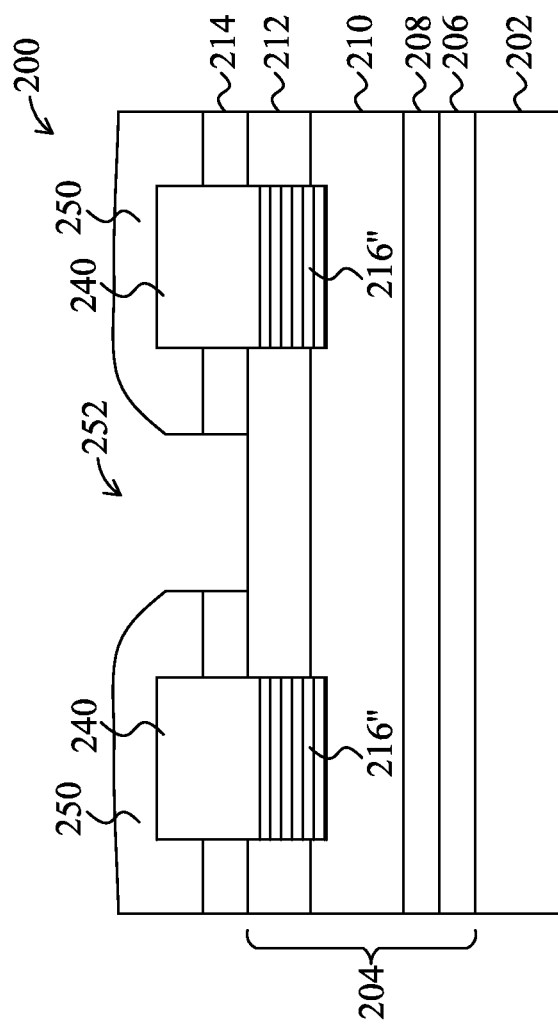

FIG. 2F is a cross sectional view of semiconductor device 200 after operation 114 in accordance with one or more embodiments. A capping layer 250 is over source and drain contacts 240 and passivation layer 214. An opening 252 is formed in capping layer 250 and passivation layer 214 to expose a portion of top group III-nitride compound layer 212 between source and drain regions 216". In some embodiments, opening 252 is formed during a multi-step process in which a first opening is formed in capping layer 250 and then a second opening is formed in passivation layer 214. In some embodiments, passivation layer 214 acts as an etch stop layer during formation of the first opening. Capping layer 250 limits diffusion of atoms from source and drain regions 216" to other parts of semiconductor device 200. In some embodiments, capping layer 250 comprises SiO, SiN, SiON, silicon carbide (SiC), a low-k dielectric material or other suitable dielectric material. In some embodiments, the low-k dielectric material has a dielectric constant less than a dielectric constant of silicon dioxide. In some embodiments, a thickness of capping layer 250 ranges from about 20 nm to about 1000 nm. If the thickness is less than about 20 nm, capping layer 250 does not effectively prevent atoms from diffusing from source and drain regions 216", in some embodiments. If the thickness is greater than about 1000 nm, a size of capping layer 250 increases without providing significant benefit thereby unnecessarily increasing production costs.

Returning to FIG. 1, in operation 116, a gate structure is formed. In some embodiments, the gate structure comprises a gate dielectric and a gate electrode. In some embodiments, the gate structure does not include the gate dielectric. In some embodiments, the gate structure is formed by etching an opening in the capping layer and the passivation layer between the source and drain regions. The gate dielectric and gate electrode are formed in the opening. In some embodiments, the gate dielectric and the gate electrode are formed by CVD, PVD, sputtering or other suitable method.

Figure 2G:
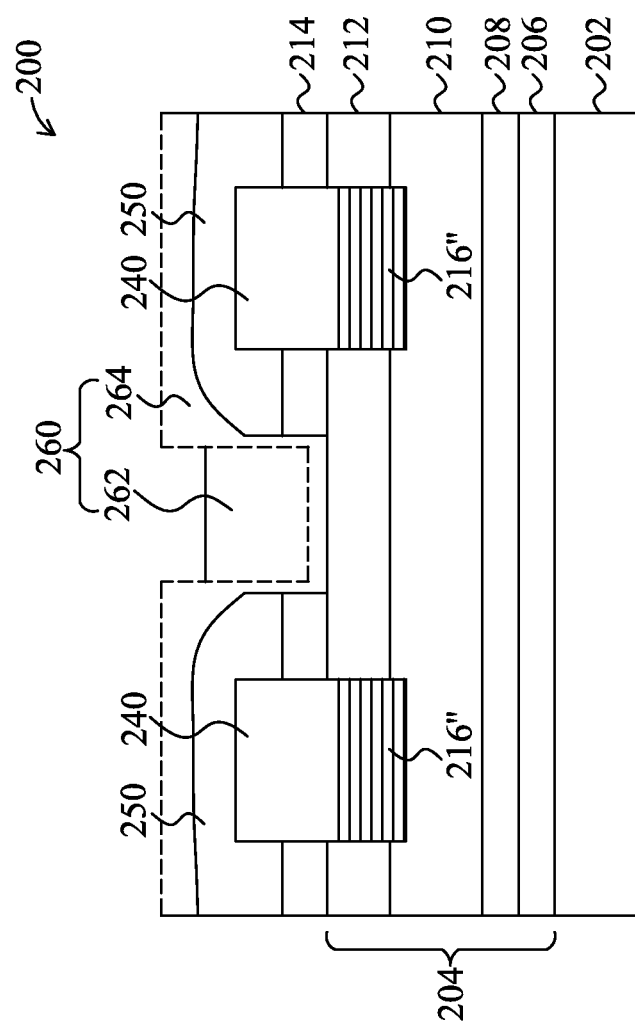

FIG. 2G is a cross sectional view of semiconductor device 200 after operation 116 in accordance with one or more embodiments. In some embodiments, gate structure 260 is over capping layer 250. Gate structure 260 contacts group III-nitride compound layer 204 between source and drain regions 216". In some embodiments where semiconductor device 200 is a high electron mobility transistor (HEMT), gate structure 260 comprises a gate electrode 262. In some embodiments, gate electrode 262 comprises polysilicon, copper, aluminum or other suitable conductive material. In some embodiments where semiconductor device 200 is a metal insulator semiconductor HEMT (MIS-HEMT), gate structure 260 comprises gate electrode 262 and a gate dielectric 264. Gate dielectric 264 is between gate electrode 262 and group III-nitride compound layer 204. In some embodiments, gate dielectric 264 comprises a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, the gate dielectric comprises silicon dioxide ($SiO_2$), silicon oxynitride (SiON), hafnium dioxide ($HfO_2$), zirconium dioxide ($ZrO_2$) or other suitable materials.

One aspect of this description relates to a method of forming a semiconductor device. The method includes forming a III-V compound layer on a substrate and implanting a main dopant into the III-V compound layer to form source and drain regions. The method further includes implanting a group V species into the source and drain regions.

Another aspect of this description relates to a semiconductor device including a substrate and a III-V compound layer over the substrate. The semiconductor device further includes source and drain regions in the III-V compound layer, wherein the source and drain regions comprises a first dopants and a second dopant, and the second dopant include a group V material.

Still another aspect of this description relates to a method of forming a semiconductor device. The method includes forming a group III-nitride compound layer over a substrate and forming a passivation layer over the group III-nitride compound layer. The method further includes implanting a main dopant into the group III-nitride compound layer to form source and drain regions and implanting a group V species in the source and drain regions. The method further includes activating the source and drain regions. The method further includes forming a capping layer over the source and drain regions and forming a gate structure over the group III-nitride compound layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A transistor on a substrate, the transistor comprising:
   a channel region at an interface between a first III-V compound layer and a second III-V compound layer; and
   a first source/drain region in the first and second III-V compound layers, wherein the first source/drain region comprises first dopants of a group V material, and wherein an interface between the first source/drain region and a first source/drain contact is below a topmost surface of the second III-V compound layer in a cross-sectional view; and
   a second source/drain region in the first and second III-V compound layers, wherein the second source/drain region comprises second dopants of the group V material.

2. The transistor of claim 1, wherein an interface between the second source/drain region and a second source/drain contact is below the topmost surface of the second III-V compound layer in the cross-sectional view.

3. The transistor of claim 1, wherein the first source/drain region further comprises main dopants, wherein the main dopants are n-type dopants or p-type dopants, and wherein a ratio of the main dopants to the first dopants ranges from 1,000:1 to 10:1.

4. The transistor of claim 1 further comprising a passivation layer over the first and second III-V compound layers, wherein the first source/drain contact extends through the passivation layer.

5. The transistor of claim 4 further comprising a gate extending through the passivation layer to contact the topmost surface of the second III-V compound layer in the cross-sectional view.

6. The transistor of claim 5 further comprising a capping layer over the passivation layer, wherein the gate further extends through the capping layer.

7. The transistor of claim 1, wherein the first source/drain region and the second source/drain region each extend below the interface between the first III-V compound layer and the second III-V compound layer.

8. The transistor of claim 1, wherein the first and second III-V compound layers are disposed on a semiconductor substrate, and wherein one or more buffer semiconductor layers are disposed between the first III-V compound layer and the semiconductor substrate.

9. The transistor of claim 1, wherein a thickness of the first III-V compound layer is in a range of 1 μm to 10 μm.

10. The transistor of claim 1, wherein a thickness of the second III-V compound layer is in a range of 20 Å to 300 Å.

11. A semiconductor device comprising:
    a substrate;
    a first III-V compound layer over the substrate;
    a second III-V compound layer over the first III-V compound layer, wherein a 2-D electron gas (2-DEG) is located at an interface between the first III-V compound layer and the second III-V compound layer;
    a source/drain region in the second III-V compound layer, wherein the source/drain region is doped with a group V species;
    a passivation layer over the second III-V compound layer;
    a source/drain contact coupled to the source/drain region, the source/drain contact extending through the passivation layer to below a bottom surface of the passivation layer; and
    a gate structure extending through the passivation layer to the second III-V compound layer.

12. The semiconductor device of claim 11, further comprising a first buffer layer between the substrate and the first III-V compound layer, wherein a crystal structure of the first buffer layer is closer to a crystal structure the first III-V compound layer than a crystal structure of the substrate is to the crystal structure of the first III-V compound layer.

13. The semiconductor device of claim 12, further comprising a second buffer layer between the substrate and the first buffer layer, wherein a crystal structure of the second buffer layer is closer to the crystal structure the first buffer layer than the crystal structure of the substrate is to the crystal structure of the first buffer layer.

14. The semiconductor device of claim 11 further comprising a capping layer over the passivation layer, wherein the gate structure extends through the capping layer.

15. The semiconductor device of claim 11, wherein a ratio of the group V species in the source/drain region to a main dopant in the source/drain region is in a range of 10:1 to 100:1.

16. A semiconductor device comprising:
a substrate;
a first III-V compound layer over the substrate;
a second III-V compound layer over the first III-V compound layer; and
a source/drain region in the second III-V compound layer, wherein the source/drain region comprises a group V material, and wherein an interface between a source/drain contact and the source/drain region is disposed below a topmost surface of the second III-V compound layer and above a bottommost surface of the second III-V compound layer in a cross-sectional view.

17. The semiconductor device of claim 16, wherein the source/drain region further extends into the first III-V compound layer.

18. The semiconductor device of claim 16 further comprising:
a passivation layer over the second III-V compound layer, wherein the source/drain contact extends through the passivation layer; and
a gate structure extending through the passivation layer to the second III-V compound layer.

19. The semiconductor device of claim 16, wherein the source/drain region extends below a topmost surface of the first III-V compound layer in the cross-sectional view.

20. The semiconductor device of claim 19, wherein the source/drain region stops at a level above a bottommost surface of the first III-V compound layer in the cross-sectional view.

* * * * *

UNITED STATES PATENT AND TRADEMARK OFFICE
CERTIFICATE OF CORRECTION

PATENT NO. : 11,984,486 B2
APPLICATION NO. : 18/158192
DATED : May 14, 2024
INVENTOR(S) : Chiu et al.

Page 1 of 1

It is certified that error appears in the above-identified patent and that said Letters Patent is hereby corrected as shown below:

In the Claims

In Column 9, in Claim 15, Line 20, delete "100:1." and insert -- 1,000:1. --.

Signed and Sealed this
Eighteenth Day of June, 2024

Katherine Kelly Vidal
*Director of the United States Patent and Trademark Office*